(12) United States Patent
Fong et al.

(10) Patent No.: US 8,877,546 B2
(45) Date of Patent: Nov. 4, 2014

(54) ENHANCED SEMICONDUCTOR DEVICES EMPLOYING PHOTOACTIVE ORGANIC MATERIALS AND METHODS OF MANUFACTURING SAME

(75) Inventors: Hon Hang Fong, Kowloon (HK); Mingqian He, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 255 days.

(21) Appl. No.: 12/790,113

(22) Filed: May 28, 2010

(65) Prior Publication Data

US 2011/0291077 A1 Dec. 1, 2011

(51) Int. Cl.
*H01L 51/40* (2006.01)
*H01L 51/00* (2006.01)
*H01L 51/05* (2006.01)

(52) U.S. Cl.
CPC .......... *H01L 51/002* (2013.01); *H01L 51/0043* (2013.01); *H01L 51/0037* (2013.01); *H01L 51/0566* (2013.01)
USPC .. 438/99; 257/40; 257/E21.175; 257/E29.277

(58) Field of Classification Search
CPC ............................ H01L 51/0545; B82Y 10/00
USPC .................... 257/40, E51.025, E21.175, 582; 438/99, 780, 795
See application file for complete search history.

(56) References Cited

U.S. PATENT DOCUMENTS

| | | | | |
|---|---|---|---|---|
| 3,779,778 A * | 12/1973 | Smith et al. | ................ | 430/270.1 |
| 4,985,332 A * | 1/1991 | Anderson et al. | ............. | 430/176 |
| 5,198,153 A * | 3/1993 | Angelopoulos et al. | ...... | 252/500 |
| 6,060,333 A * | 5/2000 | Tanaka et al. | ................... | 438/30 |
| 7,232,650 B2 * | 6/2007 | Leatherdale et al. | ......... | 430/321 |
| 7,691,691 B1 * | 4/2010 | Cleeves | ........................ | 438/163 |
| 2003/0080426 A1 * | 5/2003 | Klauk et al. | .................. | 257/744 |
| 2003/0092232 A1 * | 5/2003 | Klauk et al. | .................. | 438/200 |
| 2003/0234398 A1 * | 12/2003 | Aoki et al. | ...................... | 257/72 |
| 2005/0181566 A1 * | 8/2005 | Machida et al. | ............. | 438/301 |
| 2006/0197884 A1 | 9/2006 | Kim et al. | | |
| 2006/0270066 A1 * | 11/2006 | Imahayashi et al. | .............. | 438/4 |
| 2007/0148812 A1 | 6/2007 | Wu et al. | | |
| 2007/0290194 A1 * | 12/2007 | Becker et al. | ................... | 257/40 |
| 2008/0044964 A1 * | 2/2008 | Kamath et al. | ................ | 438/164 |

FOREIGN PATENT DOCUMENTS

| | | |
|---|---|---|
| WO | 2008/013427 | 1/2008 |
| WO | 2008013427 A1 | 1/2008 |
| WO | 2008144756 A1 | 11/2008 |

OTHER PUBLICATIONS

Weidkamp et al. ("A photopatternable Pentacene precursor for use in organic thin-film transistors", J. Am. Chem. Soc. 2004, 126, 12740-12741).*

(Continued)

*Primary Examiner* — Lex Malsawma
*Assistant Examiner* — Eric Jones
(74) *Attorney, Agent, or Firm* — Jason A. Barron

(57) ABSTRACT

Methods and apparatus provide for a transistor, including: a semiconductor layer including molecules, protons, and/or ions, etc. diffused therein from a photoactive material; a channel disposed on or in the semiconductor layer; a source disposed on or in the semiconductor layer; a drain disposed on or in the semiconductor layer; and a gate electrically coupled to the semiconductor layer.

19 Claims, 8 Drawing Sheets

(56) References Cited

OTHER PUBLICATIONS

Kitamura et al.; "Pentacene-based organic field-effect transistors"; Journal of Physics: Condensed Matter, Institute of Physics Publishing, Bristol, GB, vol. 20, No. 18; May 7, 2008.

Lee et al.; "A Soluble Polyaniline Substituted with t-BOC: Conducting Patterns and Doping" Macromolecules, American Chemical Society, Washington DC, vol. 37, May 5, 2004, pp. 4070-4074.

Potje-Kamloth "Photochemical Tuning of Field-Effect Transistor with Polyaniline Gate Conductor" Advanced Materials 2001, 13, No. 23, Dec. 3, pp. 1797-1800.

PCT/US2011/038017 Search Report and Written Opinion.

Liu et al.; "Photoactivated and patternable charge transport materials and their use in organic light-emitting devices"; Applied Physics Letters 90, 233503 (2007).

* cited by examiner

100

ENHANCED SEMICONDUCTOR DEVICES EMPLOYING PHOTOACTIVE ORGANIC MATERIALS AND METHODS OF MANUFACTURING SAME

BACKGROUND

The present disclosure relates to the manufacture of semiconductor devices, such as transistors, semiconductor-implemented resistors, diodes, etc. Such transistors include thin film transistors (TFTs), which are useful in many areas of technology, such as electronic applications, including OLEDs, liquid crystal displays (LCDs), photovoltaic devices, integrated circuits, etc.

Transistors, such as field-effect transistors (FETs) may be fabricated using a variety of architectures depending on the type of substrate technology employed, the complexity of the fabrication process, and the desired function and characteristics of the transistor. In the flat panel display industry, TFTs are used for several purposes, including for use as the discrete transistors for switching each pixel of a liquid crystal display (LCD), or for the discrete transistors used to drive the respective pixels of an organic light-emitting diode (OLED) display. There are, of course, many other uses of TFTs in display technologies, including the circuitry related to the discrete pixel circuitry, such as the array control circuitry, driving circuitry, and test circuitry, much of which may be disposed at the periphery of the pixel display area.

FETs may be formed from inorganic material and/or organic materials. Conventional organic transistors are typically formed horizontally on firm or flexible substrates. The transistor structure includes gate, drain and source electrodes, as well as an organic semiconducting layer and an electrical insulating layer (a gate dielectric). The organic semiconducting layer functions as a hole, electron, or ambipolar charge transporting channel. The electrodes are deposited by thermal processes, e-beam evaporation, or sputtering, and usually employ metals, metal compounds, transparent conducting oxides or conducting organic materials.

It is desirable to improve the electrical characteristics of FETs in terms of two important factors affecting transistor performance: (a) the channel field effect mobility of the semiconducting layer, and (b) the charge injection efficiency of carriers from the drain-source electrodes to the channel.

SUMMARY

Factors that are important in establishing transistor performance include: (a) the channel field effect mobility of the semiconducting layer; and (b) the charge injection efficiency of carriers from the drain-source electrodes to the channel. The charge injection efficiency is measured by the contact resistance established along the electrode/channel interface. A high performance transistor should possess high mobility with a small sub-threshold swing, small contact resistance and large ON/OFF ratio.

Certain methods have been shown to be effective in enhancing the channel field effect mobility of the transistor. One known method is to reduce the interface traps or defects between the channel and the gate dielectric via inserting a buffer layer. This buffer layer can be a self-assemble mono-(multi-)layer(s) or small molecule (such as hexamethyldisilazane or Hexamethyldisiloxane—HMDS) or polymer (such as fluoropolymers), which can react or passivate the surface state of the dielectric to minimize the charge trapping nature of certain surface chemical states, such as hydroxyl groups of the surface of silicon oxide. However, this approach does not further enhance the intrinsic mobility of the channel while its mobility is yet determined by the bulk properties of the channel material.

In another known method, the field effect mobility can be extrinsically influenced by chemical doping to the channel using a strong acid. This doping can intentionally lead to an increase in conductivity, but also causes a substantial reduction of gate modulation and lowering of the ON/OFF ratio. Hence, developing an extrinsically doped channel with enhanced mobility and without denigrating the ON/OFF ratio is yet to be achieved by known methods.

The contact resistance between electrodes (drain, source) and the organic (or inorganic) semiconducting layer is on the order of about a K-Ohm or higher due to material mismatches, and is expected to significantly limit charge injection in devices with reduced channel length (the distance between drain and source electrodes). To improve the charge injection from the drain-source electrodes to the channel, several approaches are known from the literature. Self-assemble monolayers (SAMs) are used to modify the surface of dielectric or contacts so as to improve transistor performance. Such monolayers can only be assembled on certain dielectric or conducting surfaces, and may cause a de-wetting problem for solution processed organic materials. Moreover, strong oxidizing/reducing small molecular dopants, such as F4TCNQ, can be inserted between the drain-source electrodes and the channel in order to reduce the contact resistance. However, SAM deposition is usually a self-limiting process that can be employed on metal or metal oxide surfaces with certain surface chemical functional groups. Therefore, SAM deposition is suitable for application to a transistor with bottom-contact geometry where the drain-source electrodes are pre-deposited and pre-patterned prior to the SAM deposition. SAM deposition, however, is not suitable for application to a transistor with top-contact geometry, since molecular assembly on the surface of an organic channel is not trivial. Apart from metallic drain-source electrodes, conducting polymers are likely to form a low contact resistance interface with the channel whereas patterning the conducting polymer as top electrodes requires a specific family of photoresist and processing/developing solvent. Laser interference patterning is an alternative to pattern conducting polymers in order to achieve small channel length on an organic transistor.

Besides reducing the contact resistance for drain and source electrodes, there is a great demand to pattern high conductivity electrodes on top of an organic channel. For example, it would be desirable to fabricate a sub-micron channel, top-contact organic transistor. Dispersing carbon nanotube into poly(acrylic acid) or poly(4-styrenesulfonic acid) in water may provide a high conductivity electrode, which is also photo-patternable. A shadow mask method may achieve a channel length down to about five microns, but such a process is impractical to produce smaller channel devices. It is known that traditional photo-resist systems, comprising an aggressive organic solvent and a strong base developer, are also incompatible to pattern top contacts on top of an organic channel due to chemical damage.

Until now, there has been a lack of a general method which can form a high conductivity and high resolution patterned electrode by direct converting the semiconducting state of a channel into the conducting state via lithographic control (processing).

Exemplary embodiments disclosed herein overcome these technical deficiencies in the art associated with the fabrication of transistor based devices. Methods and apparatus described and disclosed herein provide for high mobility organic channels and/or high conductivity electrical organic ohmic contacts in organic transistors and corresponding electronic devices on selective or patterned region by photoacid generators.

In an exemplary embodiment, a transistor device includes: a substrate, a gate electrode, a drain electrode, a source electrode, a dielectric layer, and an organic semiconducting channel layer. These layers can be stacked in different sequences to form a laterally or vertically configured transistor device. The organic semiconducting channel layer may include small molecules, oligomers or polymers which may include thiophene or other semiconducting units. The nature of this organic technology permits selectively: a) engineering the field effect mobility of the organic semiconducting channel, and b) creating patternable ohmic contacts with the channel using photoacid generators (PAGs).

In the case of increasing the field effect mobility, PAGs are deposited either into the organic semiconducting channel or on the surface of the channel. In the case of creating organic ohmic contacts with the channel, PAGs, as an individual or a mixture with other carriers, such as resist, are deposited onto the contact drain/source regions. These PAGs may be activated by photons or electrons through lithographic methods in order to define the processing regions of the channel. Thermal energy, such as laser or thermal radiations may be selectively applied to the device to adjust the activation or deactivation process of the PAGs, as well as to control the diffusion of the PAGs. Base compounds such as HMDS can be disposed to adjust or quench the activation of the PAGs.

In accordance with one or more embodiments disclosed herein, methods and apparatus provide for a transistor, comprising: a semiconductor layer including protons diffused therein from a photoactive organic material; a channel disposed on or in the semiconductor layer; a source disposed on or in the semiconductor layer; a drain disposed on or in the semiconductor layer; and a gate electrically coupled to the semiconductor layer.

In accordance with one or more further embodiments disclosed herein, methods and apparatus provide for a transistor, comprising: a semiconductor layer; a channel disposed on or in the semiconductor layer; a source disposed on or in the semiconductor layer; a drain disposed on or in the semiconductor layer; and a gate electrically coupled to the semiconductor layer, wherein one or more of the source, drain, and gate are doped with photoacid material.

In accordance with one or more still further embodiments disclosed herein, methods and apparatus provide for a transistor, comprising: a semiconductor layer; a channel disposed on or in the semiconductor layer; a source electrically coupled to the semiconductor layer; a drain electrically coupled to the semiconductor layer; a gate electrically coupled to the semiconductor layer; and a layer of photoacid material disposed at least one of: (i) between the source and the channel, and (ii) between the drain and the channel.

In accordance with one or more still further embodiments disclosed herein, a method of forming a transistor includes: forming a channel on or in a semiconductor layer; disposing a photoactive organic material in contact with the semiconductor layer; and exposing the photoactive organic material to light such that protons diffuse into the channel from the photoactive organic material.

Other aspects, features, advantages, etc. will become apparent to one skilled in the art when the description of the embodiments herein are taken in conjunction with the accompanying drawings.

BRIEF DESCRIPTION OF THE DRAWINGS

For the purposes of illustrating the various aspects of the embodiments disclosed herein, there are shown in the drawings forms that are presently preferred, it being understood, however, that the disclosed embodiments are not limited to the precise arrangements and instrumentalities shown.

DETAILED DESCRIPTION

Figure 1:
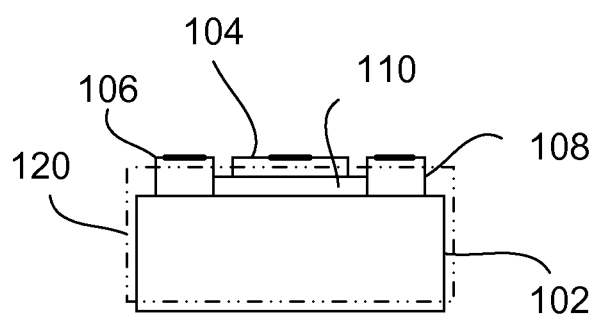
FIG. 1 is a side schematic view of a FET transistor employing a semiconductor layer having protons diffused therein from a photoactive material.

With reference to the drawings, wherein like numerals indicate like elements, there is shown in FIG. 1 a side-view of a transistor 100 in accordance with one or more embodiments. The transistor 100 may be in the form of a FET transistor, such as a thin-film transistor (TFT) and has application for use in displays, such as LCD, OLED displays, and/or other technologies. The transistor 100 includes a semiconductor layer 102. A gate contact and/or electrode (or simply "gate") 104 is disposed on or in the semiconductor layer 102, as is a drain contact and/or electrode (or simply "drain") 106, and a source contact and/or electrode (or simply "source") 108. The gate 106 is disposed over an insulating (or dielectric) layer 110, which is thus located between the gate 104 and the semiconductor layer 102. The gate dielectric layer 110 is some form of insulating layer, such as an oxide layer, an organic layer, an inorganic layer, or other type of layer. For purposes of this description, the dielectric layer 100 may be referred to as the gate oxide layer 110. A region of the semiconductor layer 102 under the gate oxide 110 is a channel 103 of the transistor 100. The gate, drain, and source electrodes may be formed by transparent conducting oxides, conducting polymers, chemically doped organic layers, or metals using techniques well known in the art.

The embodiments disclosed and described herein have particular application to semiconductor devices (such as transistors, resistors, diodes, integrated circuits, etc.), and particularly to organic semiconductor devices. It is noted, however, that, any other types of semiconductor devices, such as inorganic transistors, resistors, diodes, integrated circuits, etc., may benefit from the use of the methods and apparatus herein.

Exemplary embodiments disclosed and described herein include features that improve the performance of the transistor 100 through the use of a photoactive material. For example, employing a photoactive material has been found to improve the field effect mobility of the channel 103 and may improve the conductivity of the electrical contacts associated with at least the drain 106 and source 108. As schematically illustrated in FIG. 1, the transistor 100 includes a photoactive material, schematically illustrated as element 120. The photoactive material 120 may be disposed in or on the semiconductor layer 102, the gate 104, the drain 106, and/or the source 108. The photoactive material may include one of: a photoacid generator, a photobase generator, and a photo-radical generator. As used herein, the phrase "photoacid generator" refers to any organic photoacid material or photosensitive acidic material. The photoacid generator may include at least one cleaving group (not limited to t-Boc groups) that can be selectively removed via radiative energy, such as photons, e-beam or x-ray energy. It is noted, however, that the photoacid generator need not be radiated with any specific wavelengths of energy.

Figure 2A:
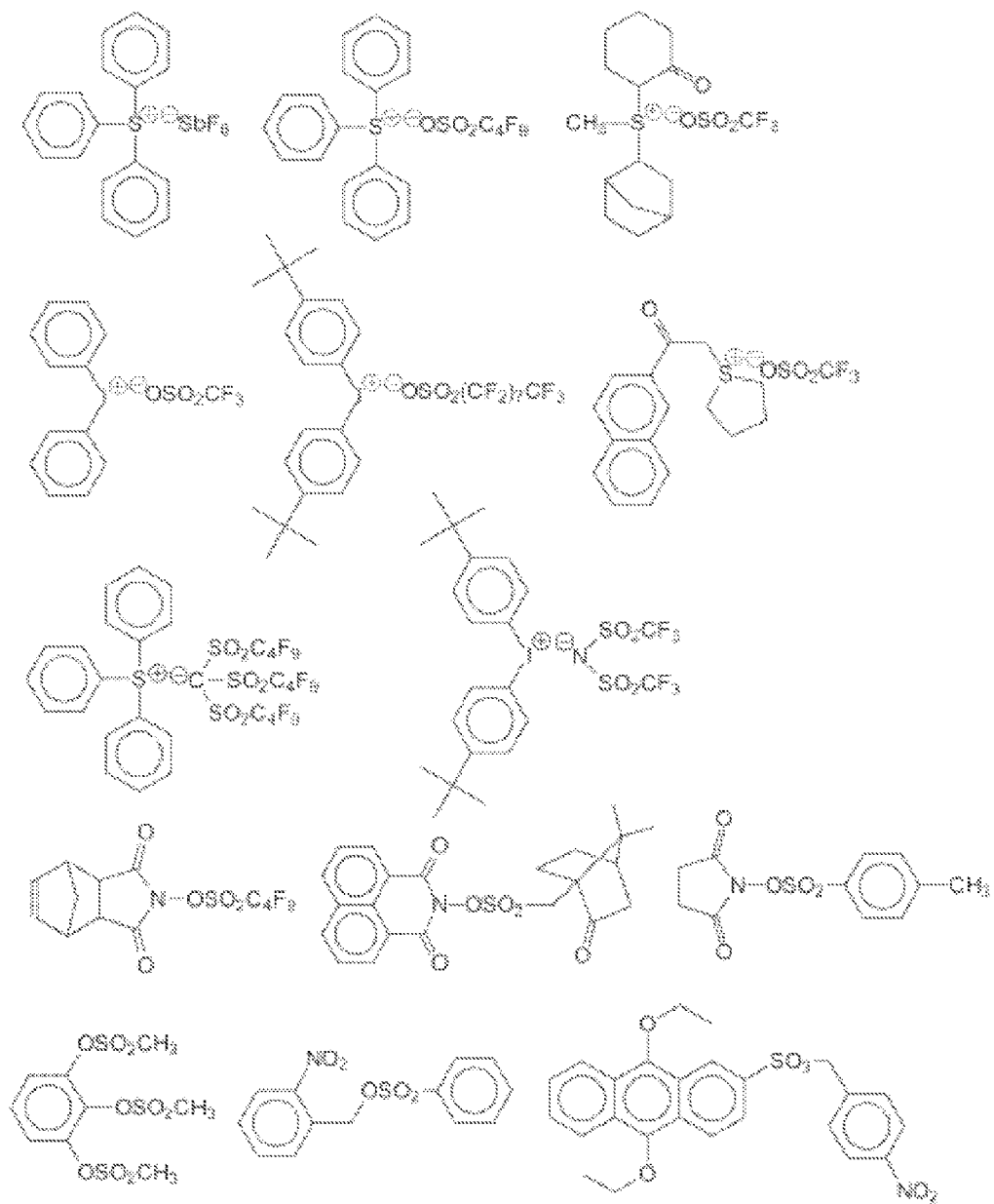
FIGS. 2A-2B illustrate a number of photoactive materials suitable for use in manufacturing the FET of FIG. 1.
Figure 2B:
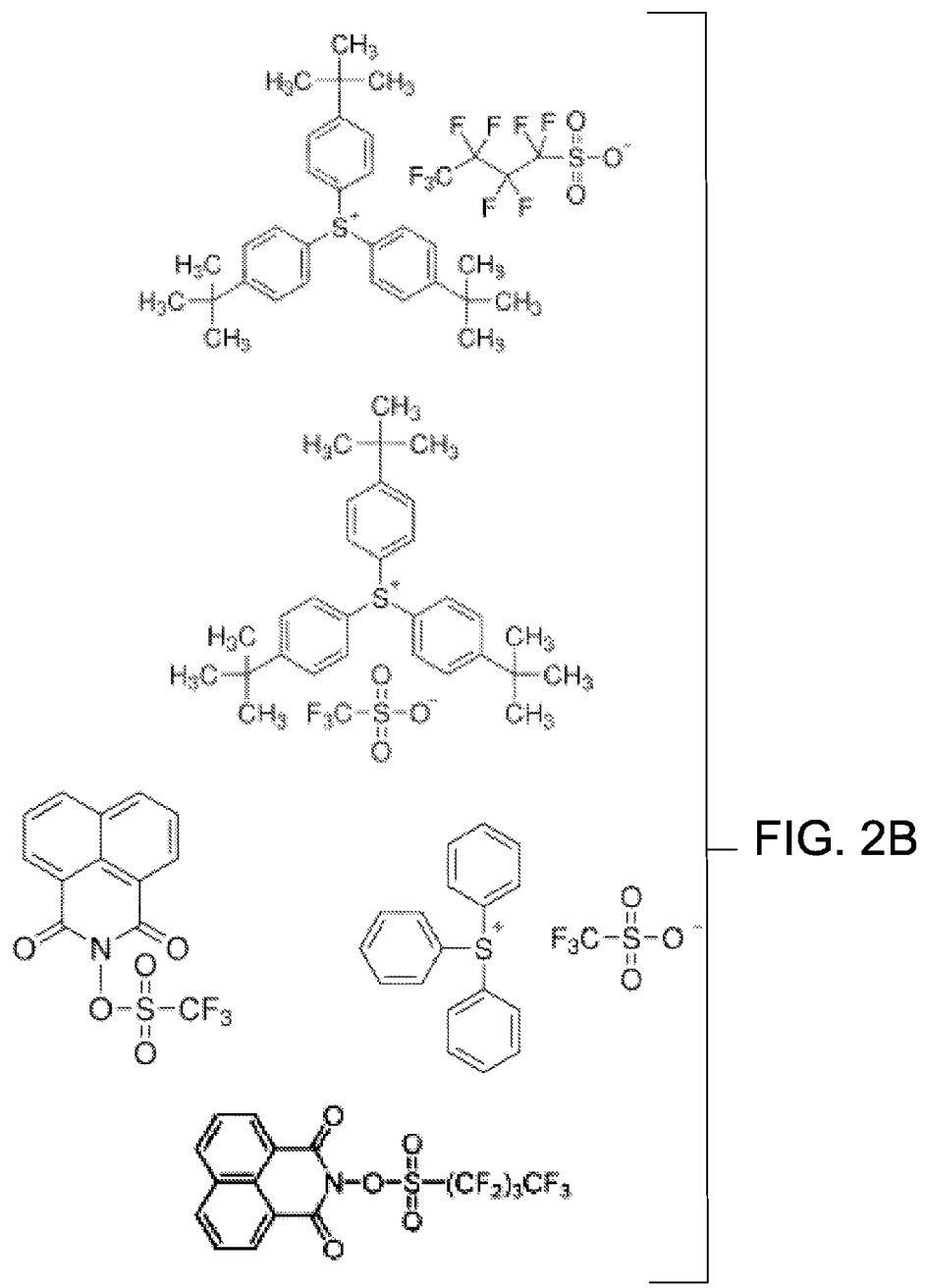

By way of example, and with reference to FIGS. 2A-2B which illustrate a number of photoactive materials, a photoacid generator may include at least one compound taken from the group consisting of: ionic (onium salt) compounds and non-ionic compounds. When the photoacid generator includes an ionic (onium salt) compound, then such compound may be taken from the group consisting of: metallic material, sulfonate material, sulfonylimide material, and sulfonylmethide material. When the photoacid generator includes a non-ionic compound, then such compound may be taken from the group consisting of: organohalide material, sulfonate ester material, sulfonate material, and sulfone material. When the photoacid generator includes a sulfonate ester material, then such material may be taken from the group consisting of: 2-nitrobenzyl ester material, aromatic sulfonate material, oxime sulfonate material, N-sulfonyloxyimide material, sulfonyloxy ketone material, and DNQ 4-sulfonate material. When the photoacid generator includes a sulfone material, then such material may be taken from the group consisting of disulfone material, ketosulfone material, and sulfonyldiazomethane material.

Further details as to the use of the photoactive material (such as the photoacid generator) in the context of specific organic or inorganic transistor implementations will be provided with reference to further drawings. In order to increase the mobility of the channel of the semiconductor layer 102, it is to be understood that broad aspects of the embodiments herein contemplate that the photoactive material 120 is disposed one of: (i) adjacent to, and in contact with, the semiconductor layer 102; and (ii) within the semiconductor layer 102. Although the embodiments, features, and advantageous results described herein are not limited to any particular theory of operation, it is believed that photon illumination of the photoactive material 120 causes molecules from the photoactive material 120 to diffuse into the semiconductor layer 102 and release protons (and/or counter ions) therein. It is also possible that the decomposed part of the photoactive material 120 diffuses or interacts with the semiconductor layer 102 to achieve the desired result.

In the case of the photoactive material 120 being disposed within the semiconductor layer 102, the photoactive material 120 may be evenly distributed or un-evenly distributed therein. The distribution of the photoactive material 120 within the semiconductor layer 102 may be achieved, for example, by permitting protons (and/or other ions, such as counter ions) from a source of photoactive material to diffuse into the semiconductor layer 102 in response to light energy. In the case where the photoactive material 120 is disposed adjacent to, and in contact with, the semiconductor layer 102, the photoactive material 120 may operate as a source of such protons or other ions.

With reference to FIGS. 3A-3D, a number of transistor configurations (which may be organic transistors or inorganic transistors) are illustrated in which the photoactive material 120 is disposed within the semiconductor layer 102.

Figure 3A:
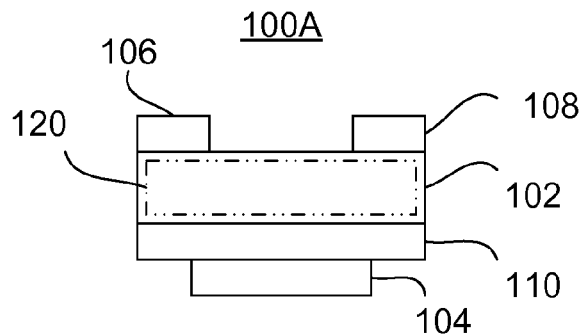
FIGS. 3A, 3B, 3C, and 3D are side schematic views of four FET transistors (a bottom-gate top-contact transistor, a bottom-gate bottom-contact transistor, a top-gate bottom-contact transistor based, and a top-gate top-contact transistor, respectively), each employing a semiconductor layer having protons diffused therein from a photoactive material.

As shown in FIG. 3A, a bottom-gate top-contact transistor 100A may include the dielectric layer 110 deposited on one side (the bottom) of the semiconductor layer 102, with the gate electrode 104 disposed on the dielectric layer 110. The drain and source electrodes 106, 108 are deposited on the opposite side (the top) of the semiconductor layer 102. The photoactive material 120, such as a photoacid generator (and/or protons, or counter ions, etc. diffused therefrom), is disposed within the semiconductor layer 102, preferably within and/or adjacent to the channel.

Figure 3B:
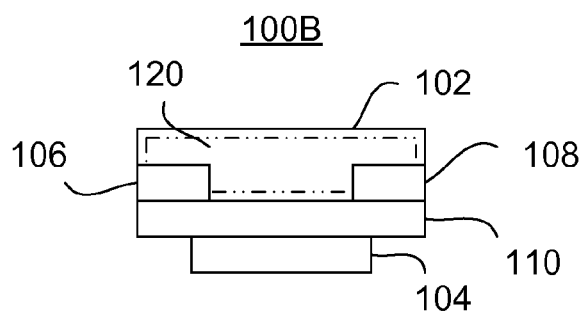

As shown in FIG. 3B, a bottom-gate bottom-contact transistor 100B may include the drain and source electrodes 106, 108 deposited on one side (the bottom) of the semiconductor layer 102, with the dielectric layer 110 also deposited on the one side. The gate electrode 104 is disposed on the dielectric layer 110. Again, the photoactive material 120, such as a photoacid generator (and/or protons, counter ions, etc. diffused therefrom), is disposed within the semiconductor layer 102, preferably within and/or adjacent to the channel.

Figure 3C:
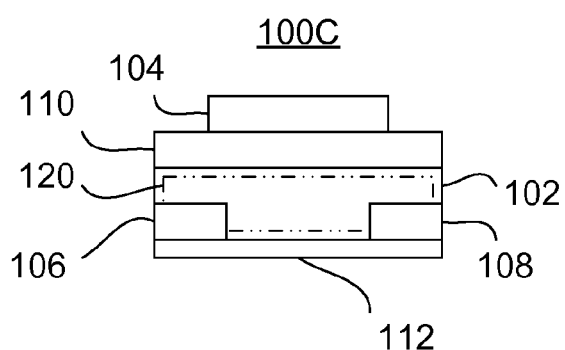

As shown in FIG. 3C, a top-gate bottom-contact transistor 100C may include a substrate 112 (such as a glass or glass ceramic material) with the drain and source electrodes 106, 108 deposited on the substrate 112. The semiconductor layer 102 is deposited on the drain 106, source 108, and substrate 112. The dielectric layer 110 is deposited on the opposite side (the top) of the semiconductor layer 102, and the gate electrode 104 is disposed on the dielectric layer 110. The photoactive material 120, such as a photoacid generator, are again disposed within the semiconductor layer 102, preferably within and/or adjacent to the channel.

Figure 3D:
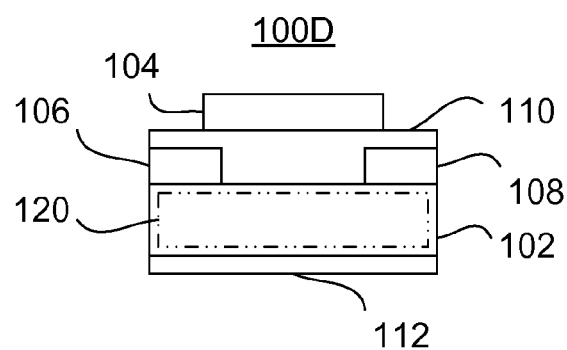

As shown in FIG. 3D, a top-gate top-contact transistor 100D may include a substrate 112 with the semiconductor layer 102 deposited thereon. The drain and source electrodes 106, 108 are deposited on semiconductor layer 102, and the dielectric layer 110 is deposited over the drain 106, source 108, and semiconductor layer 102. The gate electrode 104 is disposed on the dielectric layer 110. Once again, the photoactive material 120, such as a photoacid generator (and/or protons, counter ions, etc. diffused therefrom), is disposed within the semiconductor layer 102, preferably within and/or adjacent to the channel.

It is noted that photon illumination (e.g., through application of light energy) of the transistor structures 100A, 100B, 100C, 100D may operate to activate the photoactive material 120 to release protons into the channel of the semiconductor layer 102 in such a way as to contribute to the channel charge transport. As will be discussed further later herein, the photon illumination may be performed before or after the deposition of the drain and/or source electrodes 106, 108, and/or before or after the deposition of the dielectric layer 110.

With reference to FIGS. 4A-4D, a number of transistor configurations are illustrated in which the photoactive material 120 is disposed adjacent to, and in contact with, the semiconductor layer 102. For example, the photoactive material 120 may be deposited, above and/or below the semiconductor layer 102, and/or may be deposited on or adjacent to a lateral side of the semiconductor layer 102.

Figure 4A:
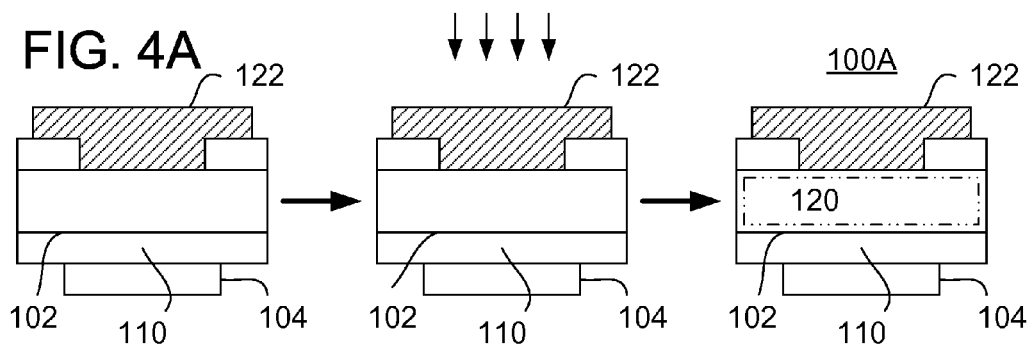
FIGS. 4A, 4B, 4C, and 4D are side schematic views of exemplary intermediate structures and process flow in order to produce the four FET transistors of FIGS. 3A, 3B, 3C, and 3D, respectively.

As shown in FIG. 4A, a bottom-gate top-contact transistor 100A may be fabricated in which the photoactive material is deposited on a side of the semiconductor layer 102 at which the drain 106 and source 108 are located. To be more precise, the gate 104 is coupled to a first side of the semiconductor layer 102 through the insulating, oxide layer 110. The photoactive material (which may be considered a source) 122 is disposed adjacent to, and in contact with, a second side of the semiconductor layer 102, opposite to the first side thereof. The photoactive material 122 may be deposited via known methods, such as direct deposition, photolithographic patterning, etc.

As illustrated by the downward directed arrows, radiative energy (such as light energy, photon energy, e-beam and/or x-ray energy, etc.) is applied to the intermediate structure such that protons, counter ions, etc. diffuse and transport from the photoactive material source 122 into the semiconductor layer 102 (specifically the channel thereof). Thermal and/or other external energy may be applied (as also illustrated by the arrows) in order to assist molecules (or protons, counter ions, etc.) from the photoactive material source 122 to diffuse into the channel and then release protons during photon illumination.

In addition, if the photoactive material source 122 is not covered by other layers, an extra layer of base compound may be employed to control the release of protons from the photoactive material source 122. For example, base compounds, such as hexamethyldisilazane or Hexamethyldisiloxane (HMDS), can be disposed to adjust or quench the activation of the photoactive material source 122 and/or the molecules that diffuse into the semiconductor layer 102. HMDS may be deposited, for example, by spin-coating followed by a thermal baking process, as is well known in the art.

Figure 4B:
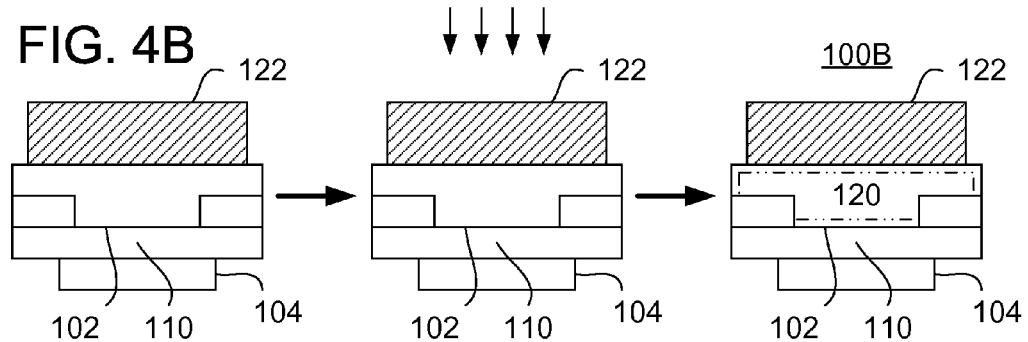

As shown in FIG. 4B, a bottom-gate bottom-contact transistor 100B may be fabricated in which the photoactive material is deposited on a side of the semiconductor layer 102 opposite to a side thereof at which the gate, 104, drain 106, and source 108 are located. To be more precise, the gate 104 is coupled to a first side of the semiconductor layer 102 through the insulating, oxide layer 110. The photoactive material source 122 is disposed adjacent to, and in contact with, a second side of the semiconductor layer 102, opposite to the first side thereof. Again, the downward directed arrows indicate application of radiative energy (and possibly thermal and/or other external energy) to the intermediate structure such that molecules, protons, counter ions, etc. diffuse and transport from the photoactive material source 122 into the semiconductor layer 102 (specifically the channel thereof). Again, if the photoactive material source 122 is not covered by other layers, an extra layer of base compound may be employed to control the release of protons from the photoactive material source 122.

Figure 4C:
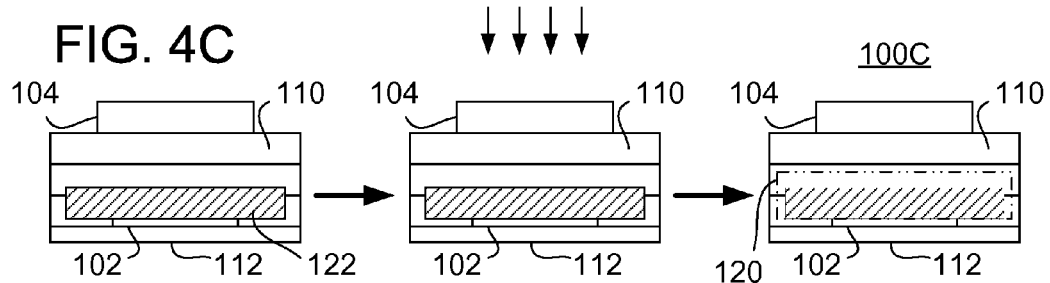

As shown in FIG. 4C, a top-gate bottom-contact transistor 100C may be fabricated in which the photoactive material is deposited on a lateral side of the semiconductor layer 102. For example, the gate 104 is coupled to a first side of the semiconductor layer 102 through the insulating, oxide layer 110. The photoactive material source 122 is disposed adjacent to, and in contact with, a second side of the semiconductor layer 102, which is transverse to, and/or lateral to, the first side thereof. As in previous embodiment(s), the downward directed arrows indicate application of radiative energy (and possibly thermal and/or other external energy) to the intermediate structure such that molecules, protons, counter ions, etc. diffuse and transport from the photoactive material source 122 into the semiconductor layer 102.

Figure 4D:
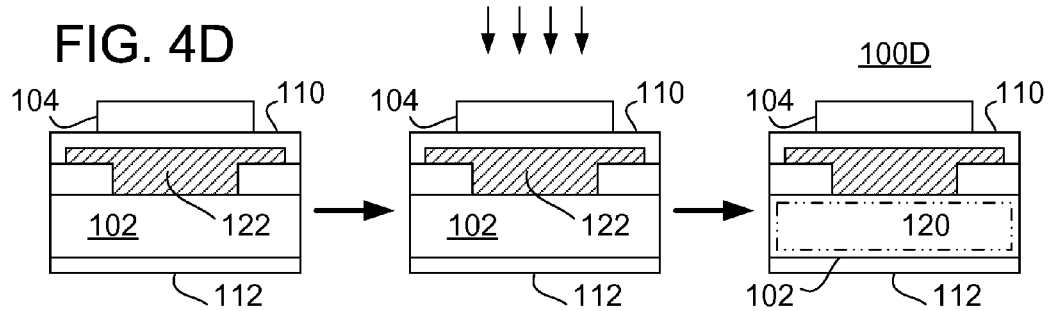

As shown in FIG. 4D, a top-gate top-contact transistor 100D may be fabricated in which the photoactive material is deposited between the insulating (e.g., dielectric or oxide) layer 110 and the semiconductor layer 102. For example, the semiconductor layer 102 is deposited on a substrate 112. The drain and source electrodes 106, 108 are deposited on a first side of the semiconductor layer 102. The photoactive material source 122 is deposited over the drain 106, source 108, and semiconductor layer 102, such that the photoactive material source 122 is adjacent to, and in contact with the semiconductor layer 102, and the photoactive material source 122 is between the insulating layer 110 and the first side of the semiconductor layer 102. The gate electrode 104 is disposed on the dielectric layer 110. As in previous embodiment(s), the downward directed arrows indicate application of radiative energy (and possibly thermal and/or other external energy) to the intermediate structure such that molecules, protons, counter ions, etc. diffuse and transport from the photoactive material source 122 into the semiconductor layer 102.

With reference to FIGS. 5A-5D, a number of transistor configurations are illustrated in which metal-free gate 104A, drain 106A, and/or source 108A contacts (preferably organic contacts) are formed using a photoactive material during fabrication. For example, a photoactive material source 122 may be deposited, above, below, and/or at least partially within the semiconductor layer 102. Thereafter, application of radiative energy releases molecules, protons, counter ions, etc. from the photoactive material source 122 that diffuse (dope) into the semiconductor layer 102 (specifically in the region of the channel) and form the drain 106A and source 108A electrodes.

Figure 5A:
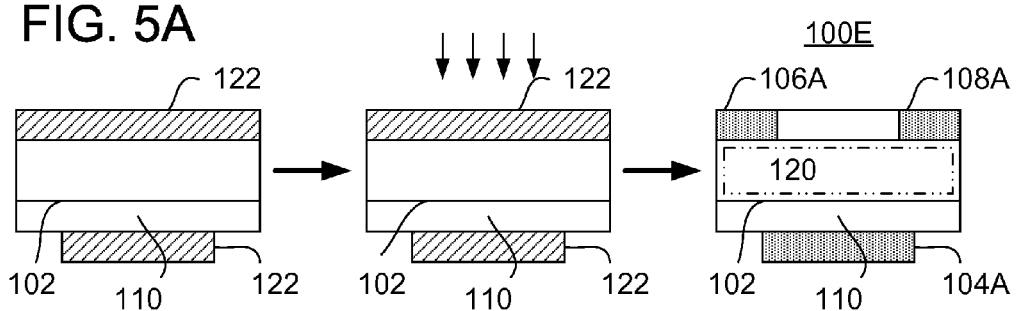
FIGS. 5A, 5B, 5C, and 5D are side schematic views of exemplary intermediate structures and process flows in order to produce four FET transistors (a bottom-gate top-contact transistor, a bottom-gate bottom-contact transistor, a top-gate bottom-contact transistor based, and a top-gate top-contact transistor, respectively), each employing photoactive material doping (e.g., a photo acid doping) in the drain, source, and/or gate electrodes.

As shown in FIG. 5A, a bottom-gate top-contact transistor 100E may be fabricated in which the photoactive material is deposited on a first side of the semiconductor layer 102 at which the drain 106A and source 108A are to be located. Additionally or alternatively, photoactive material may be deposited on a second side of the semiconductor layer 102 opposite to the first side at which the drain 106A and source 108A are to be located—in order to form the gate 104A. The oxide layer 110 may be disposed in between the photoactive material and such opposite side of the semiconductor layer 102. Again, the photoactive material 122 may be deposited via known methods, such as direct deposition, photolithographic patterning, etc.

As illustrated by the downward directed arrows, radiative energy (such as light energy, photon energy, e-beam and/or x-ray energy, etc.) is applied to the intermediate structure such that the conductivity of the photoactive material source 122 material is controlled. Through appropriate (and well known) masking techniques, distinct regions 106A, 108A may be produced, which function as drain and source electrodes, respectively. Such electrodes 106A, 108A may function as metal-free organic contacts, e.g., organic electrical conductors. The conductivity of the electrodes 106A, 108A may be controlled during fabrication by way of one or more of: (i) the composition of the photoactive material source 122, and (ii) the exposure time during which the radiative energy is applied. Similarly, the conductivity of the photoactive material source 122 on the first side of the semiconductor layer 102 may be affected in order to produce a gate electrode 104A. Such gate electrode 104A may also function as metal-free organic contact, e.g., an organic electrical conductor.

The application of the radiative energy to the intermediate structure may also cause molecules, protons, counter ions, etc. to diffuse and transport from the photoactive material source 122 (which is disposed on the first side of the semiconductor layer 102) into the semiconductor layer 102 (specifically the channel thereof). This is schematically illustrated by element 120 within the semiconductor layer 102.

As with previously described embodiments, thermal and/or other external energy may be applied (as also illustrated by the arrows) in order to assist molecules, etc. from the photoactive material source 122 to diffuse into the channel and then release protons during photon illumination.

Figure 5B:
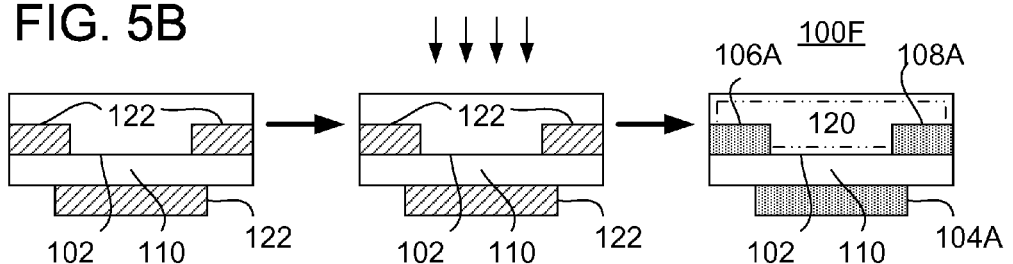
Figure 5C:
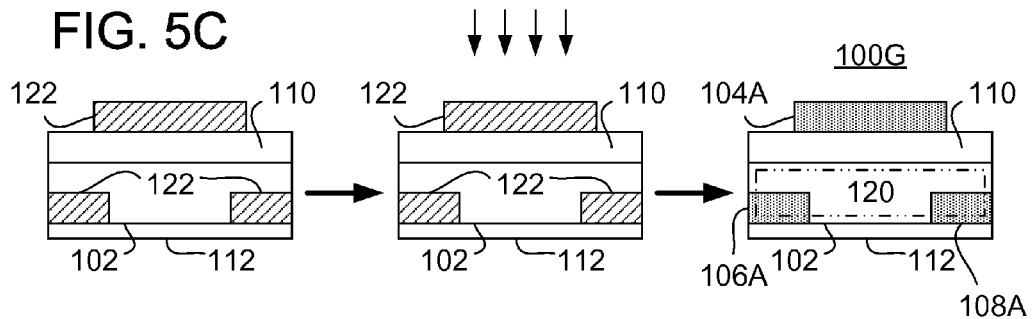
Figure 5D:
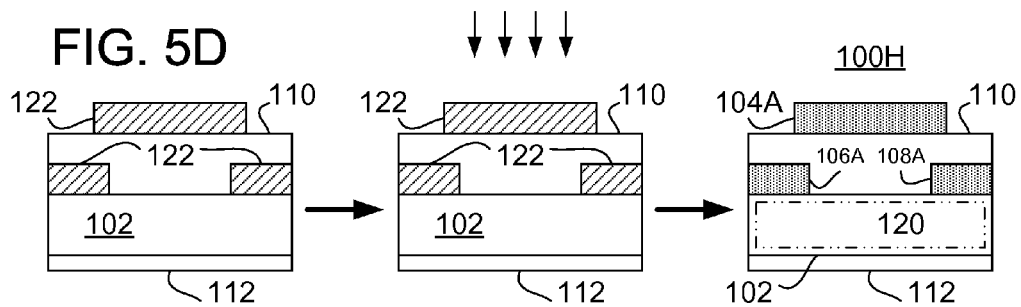
Figure 6A:
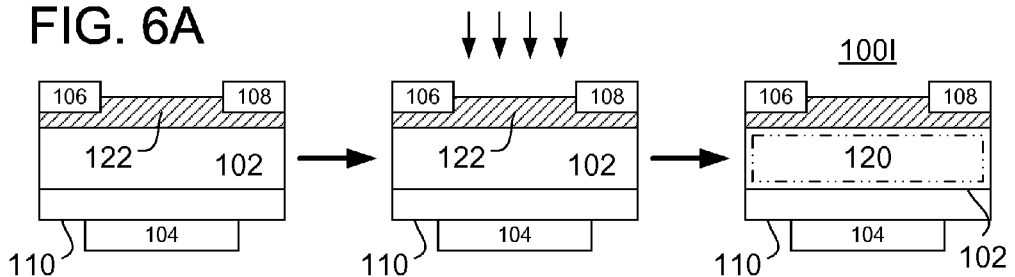
FIGS. 6A, 6B, 6C, and 6D are side schematic views of exemplary intermediate structures and process flows in order to produce four FET transistors (a bottom-gate top-contact transistor, a bottom-gate bottom-contact transistor, a top-gate bottom-contact transistor based, and a top-gate top-contact transistor, respectively), each employing a layer of photoacid material disposed at least one of: (i) between the source and the channel, and (ii) between the drain and the channel.
Figure 6B:
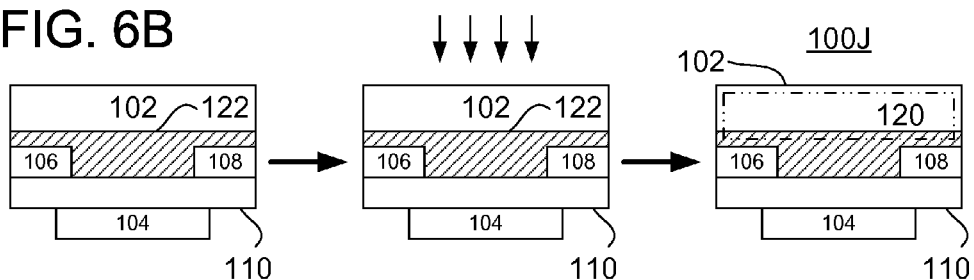
Figure 6C:
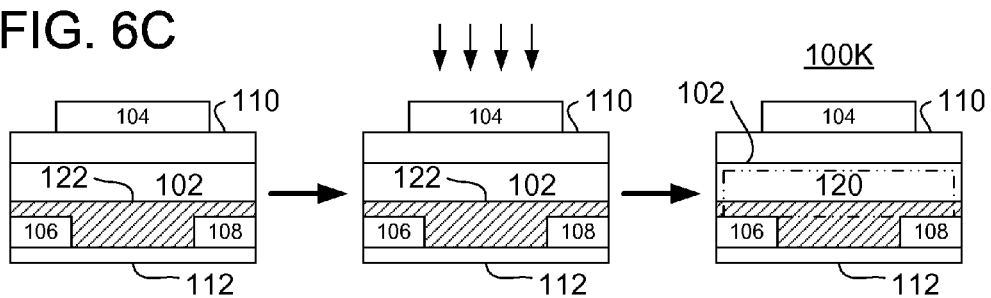
Figure 6D:
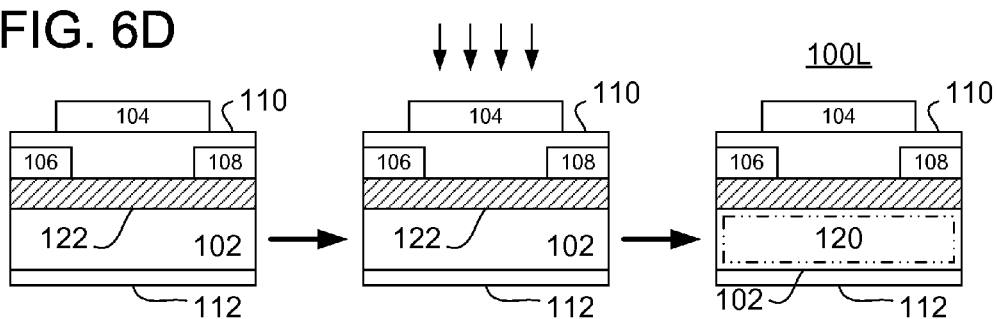

The above-described techniques may also be applied to other transistor configurations of FIGS. 5B, 5C, and 5D, which illustrate: (i) a bottom-gate bottom-contact transistor 100F, (ii) a top-gate bottom-contact transistor 100G, and (iii) a top-gate top-contact transistor 100H, respectively. In each of these configurations, one or more of the gate 104A, drain 106A, 108A may function as metal-free organic contacts, e.g., organic electrical conductors. Further, the application of the radiative energy to the intermediate structure may also cause molecules, protons, and/or ions, etc. to diffuse and transport from the photoactive material source 122 (used for the drain 106A and source 108A) into the semiconductor layer 102 (specifically the channel thereof), again as schematically illustrated by element 120 within the semiconductor layer 102.

With reference to FIGS. 6A-6D, a number of transistor configurations are illustrated in which metal gate 104, drain 106, and/or source 108 contacts are employed, with a photoactive material being employed during fabrication to improve charge injection. For example, a photoactive material source 122 may be deposited, above, below, and/or at least partially within the semiconductor layer 102—where the photoactive material source 122 is disposed at least one of: (i) between the source 108 and the channel (or semiconductor layer 102), and (ii) between the drain 106 and the channel (or semiconductor layer 102). Thereafter, application of radiative energy releases molecules, protons, and/or ions, etc. from the photoactive material source 122 that diffuse (dope) into the semiconductor layer 102 (specifically in the region of the channel), which is schematically illustrated by element 120. The above-described techniques may be applied to the transistor configurations of FIGS. 6A, 6B, 6C, and 6D, which illustrate: (i) a bottom-gate top-contact transistor 100I, (ii) a bottom-gate bottom-contact transistor 100J, (iii) a top-gate bottom-contact transistor 100K, and (iv) a top-gate top-contact transistor 100L, respectively.

In accordance with one or more further embodiments, the use of a photoactive material 120 and/or photoactive material source 122 during the fabrication of a semiconductor device (such as the aforementioned transistors) may be combined with a photolithography process in order to perform channel patterning and doping at the same time. While any of the embodiments herein may be produced in accordance with such a combined approach, for the purposes of discussion, reference is made to FIG. 7, which illustrates the techniques applied to produce a small channel, top-contact lift-off transistor 100M with enhanced mobility. In general, the process includes: forming a channel on or in the semiconductor layer 102; disposing a photoactive material 124 in contact with the semiconductor layer 102; and exposing the photoactive material 124 to light such that molecules, protons, and/or ions, etc. diffuse into the channel from the photoactive material 124.

Further details include Illustration 7(a), which shows the disposition of an oxide layer 110 on one side of the semiconductor layer 102, and disposition of the gate electrode 104 on the oxide layer 110. Illustration 7(b) shows that a photoresist, including photoactive material 124, is prepared and coated on the semiconductor layer 102 (e.g., over the channel thereof). A suitable mask (schematically illustrated as element 150) is employed to permit photon illumination (illustrated by arrows) through and to areas on the photoresist/photoactive material 124 at which the drain and source electrodes are to be located. With reference to Illustration 7(c), it is believed that through the photolithographic process, the application of the photon illumination causes molecules from the photoactive material 124 to diffuse into the semiconductor layer 102 and release protons therein (as illustrated by element number 120). It is also possible that the decomposed part of the photoactive material 124 diffuses or interacts with the semiconductor layer 102 to achieve the desired result. It may be that counter ions also affect the mechanism, as opposed to only protons. Illustration 7(d) shows that continued development of the photoresist/photoactive material 124 through the photolithographic process results in areas in which the material 124 is etched away and/or otherwise removed, and other areas in which the material 124 remains. Illustration 7(e) shows the application of metalization to the exposed surface of the semiconductor layer 102 in order to form metal drain 106 and source 108 contacts/electrodes. Illustration 7(f) shows that the patterned semiconductor layer 102 (including the channel) is created by lifting off the remaining photoresist/material 124.

While those skilled in the art will appreciate that the structures illustrated and described thus far are simplified, it is understood that many of the design nuances of discrete transistor design are available for use in fabrication such semiconductor structures, although such details have not been shown and described herein for the purposes of brevity and clarity.

In one or more embodiments, the semiconductor material of the layer 102 discussed in the embodiments above may be in the form of a substantially single-crystal material on the order of about 10-200 nm thick. The term "substantially" is used in describing the layer 102 to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material. For the purposes of discussion, it is assumed that the semiconductor layer 102 is formed from silicon. It is understood, however, that the semiconductor material may be a silicon-based semiconductor or any other type of semiconductor, such as the III-V (i.e. GaAs, GaP, InP, etc.), the IV-IV (i.e. SiGe, SiC), the elemental (i.e. Ge), or the II-VI (i.e. ZnO, ZnTe, etc) classes of semiconductors.

EXAMPLE 1

Figure 7:
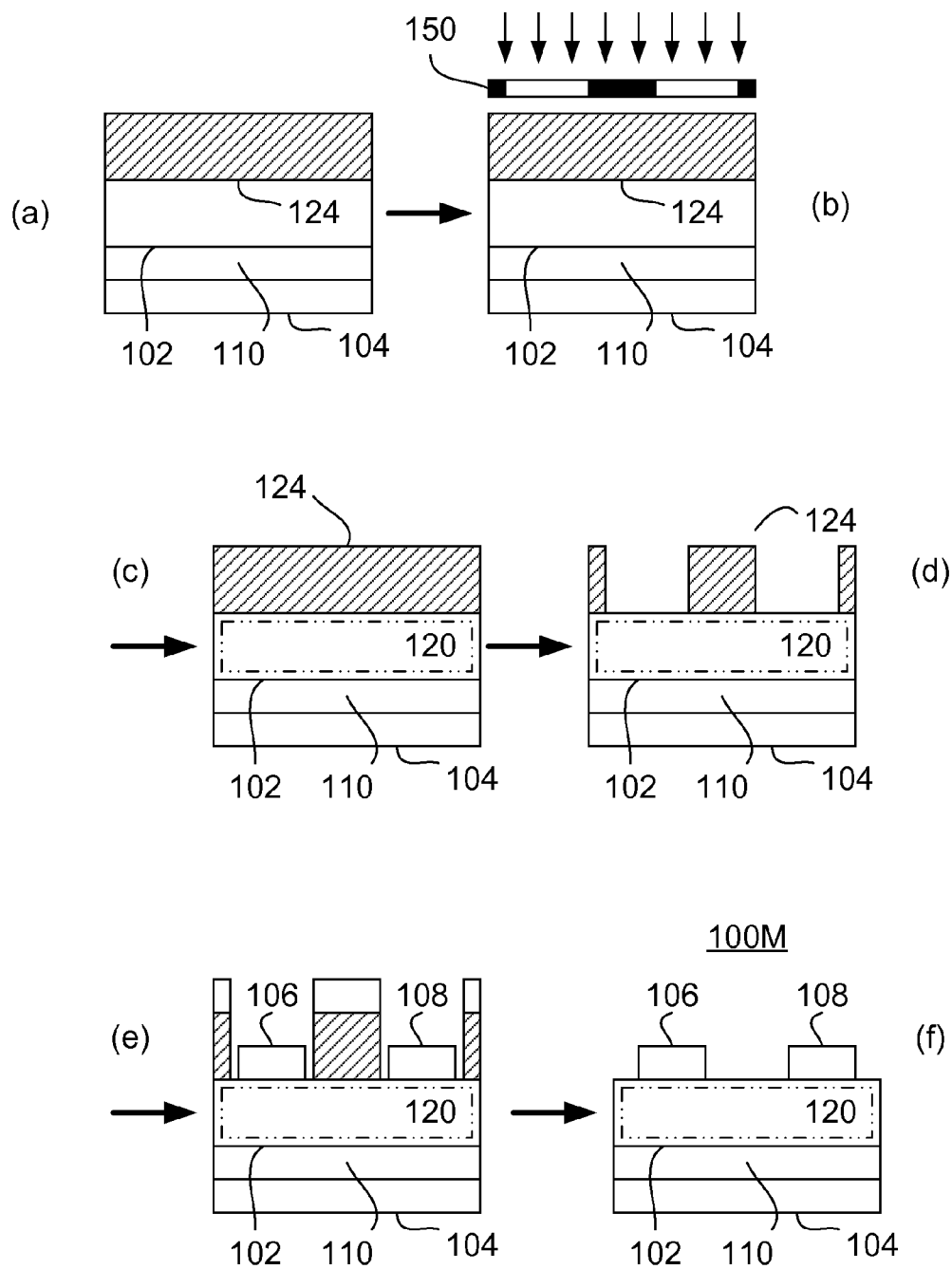
FIG. 7 illustrates side schematic views of exemplary intermediate structures and process flow in order to produce a FET transistor employing a semiconductor layer having protons diffused therein from a photoactive material using lithographic methods.

Two high mobility organic top-contact transistors were fabricated using some of the above-described structures, materials, and processes. For each, a thin layer of organic semiconducting material, such as thiophene copolymer, was disposed onto an insulating substrate. For example, a 3 mg/mL of P2TDC17FT4 dissolved in 1,2-dichlorobenzene was spin-coated on an $n^{++}Si<100>/SiO_2$ (30 nm thick) wafer. The oxide wafer was pre-baked in an $N_2$ environment to for dehydration. Then, a HMDS (greater than 99% purity) was spin-coated at 3000 rpm and further baked at 150° C. for 15 minutes in an $N_2$ environment. A mg/mL of P2TDC17FT4 dissolved in 1,2-dichlorobenzene was spin-coated on the $SiO_2$ wafer at 1 krpm to form a 20-30 nm thin film. A novel negative-tone i-line photoresist, containing a fluorinated calixarene mixed with a greater than 20 wt % of a fluorinated photoacid generator (a non-ionic PAG) loading, was spin-coated onto the P2TDC17FT4 layer (which resulted in structures similar to those illustrated in FIG. 7, illustration (a)). The photoresist was selectively exposed under 365 nm photon illumination via a standard i-line stepper and developed using a hydrofluoroether solvent in order to create two opened regions to form drain and source electrodes by Au evaporation, which resulted in structures similar to those of FIG. 7, illustrations (b), (c), (d), (e). The photoresist was then removed and a channel was formed by a lift-off process performed using a solvent of hydrofluoroether: HMDS (9:1), which resulted in transistors of a configuration similar to that shown in FIG. 7, illustration (f).

Some performance characteristics are illustrated in the table below.

| Lift-off transistor | Dielectric | L (μm) | W (mm) | Mobility ($cm^2V^{-1}s^{-1}$) | $V_{TH}$ (V) | On/Off ratio |
|---|---|---|---|---|---|---|
| PAG A/ P2TDC17FT4 | $SiO_2$ (30 nm) | 20 | 0.2 | 0.6 (in avg) 10 (max.) | 0 −11 | >$10^3$ >$10^4$ |
| PAG A/ P2TDC17FT4 | $SiO_2$ (30 nm) | 50 | 0.5 | 1.4 (in avg) 10 (max.) | 0 −11 | >$10^3$ >$10^4$ |

EXAMPLE 2

A transistor device having an organic ohmic contact using a photoacid generator was fabricated using some of the above-described structures, materials, and processes. The transistor was fabricated by solution casting a thin layer of organic semiconducting material, such as thiophene copolymer, onto an insulating substrate. For example, a 3 mg/mL of P2TDC17FT4 dissolved in 1,2-dichlorobenzene was spin-coated on a $n^{++}Si<100>/SiO_2$ (200 nm thick) wafer. The oxide wafer was pre-baked in an $N_2$ environment for dehydration. Then, a HMDS (greater than 99% purity) was spin-coated at 3000 rpm and further baked at 150° C. for 15 min in an $N_2$ environment. A P2TDC17FT4 solution was spun at 1 krpm to form a 20-30 nm thin film. Two Au top electrodes, each with a thickness of about 40 nm were vacuum evaporated onto the polymer layer via a shadow mask. The transistor device, containing channel lengths of 50-200 μm and channel widths of 0.8-1.8 mm, demonstrated a typical FET mobility of 0.05 $cm^2V^{-1}s^{-1}$, with a threshold voltage of ~−10 V and a ON/OFF ratio of >$10^6$. A photoacid generator (a non-ionic PAG) dissolved into a hydrofluoroether: PGMEA (4:1 wt %) co-solvent was spin-coated (at 1 krpm) or drop-casted on top of the transistor device. To form an organic ohmic contact among two top Au electrodes, the transistor channel was selectively exposed under an UV light with a wavelength of 365 nm via a photolithography process using a standard i-line stepper or a shadow mask. The current-voltage characteristic between the drain and the source electrodes became linear, indicating a formation of ohmic conduction among the electrodes. Moreover, no gate modulation was observed at various gate voltages spanning from 0 to −90 V.

Some performance characteristics are illustrated in the table below.

| | 365 nm exposure 6 W hand lamp | L (μm) | W (mm) | Conductivity (S/cm) |
|---|---|---|---|---|
| PAG A/ P2TDC17FT4 | 1 min | 100 | 1.8 | 0.7 |
| PAG A/ P2TDC17FT4 | 3 min | 100 | 1.8 | 25 |
| PAG A/ P2TDC17FT4 | 5 min | 100 | 1.8 | 225 |

Although the embodiments herein have been described with reference to particular features and aspects, it is to be understood that these embodiments are merely illustrative. It is therefore to be understood that numerous modifications may be made to the illustrative embodiments and that other arrangements may be devised without departing from the spirit and scope of the disclosure.

The invention claimed is:

1. A method of forming a transistor, comprising:
   forming a channel on or in a semiconductor layer, wherein the semiconductor layer comprises an organic semiconductor and a separate organic photoactive material; and
   exposing the photoactive material to light such that molecules, protons, and/or ions diffuse through the channel from the photoactive material;
   disposing one or more of a source, a drain, and a gate doped with the photoactive material in the semiconductor layer; and
   exposing the source, the gate, and/or the drain to light such that molecules, protons, and/or ions diffuse into the channel from the photoactive material.

2. The method of claim 1, wherein the organic semiconductor comprises a thiophene.

3. The method of claim 1, wherein the photoactive material comprises one of a photoacid generator, a photobase generator, and a photo-radical generator.

4. The method of claim 3, wherein the photoactive material comprises a photoacid generator including at least one compound taken from the group consisting of: ionic (onium salt) compounds and non-ionic compounds.

5. The method of claim 3, wherein the photoacid generator comprises an ionic (onium salt) compound taken from the group consisting of metallic material, sulfonate material, sulfonylimide material, and sulfonylmethide material.

6. The method of claim 3, wherein the photoacid generator comprises a non-ionic compound taken from the group consisting of organohalide material, sulfonate ester material, sulfonate material, and sulfone material.

7. The transistor of claim 6, wherein the photoacid generator comprises a sulfonate ester material taken from the group consisting of 2-nitrobenzyl ester material, aromatic sulfonate material, oxime sulfonate material, N-sulfonyloxyimide material, sulfonyloxy ketone material, and DNQ 4-sulfonate material.

8. The transistor of claim 6, wherein the photoacid generator comprises a sulfone material taken from the group consisting of disulfone material, ketosulfone material, and sulfonyldiazomethane material.

9. A transistor, comprising:
   an organic semiconductor layer;
   a channel disposed on or in the organic semiconductor layer;
   a source disposed on the organic semiconductor layer;
   a drain disposed on the organic semiconductor layer;
   and a gate electrically coupled to the organic semiconductor layer;
   a photoactive material disposed in the organic semiconductor layer;

wherein the organic semiconductor layer comprises an organic semiconductor and a separate organic photoactive material, and photoactive material disposed in one or more of the source, drain, and gate; and wherein molecules, protons, and/or ions diffuse from the photoactive material into the channel of the organic semiconductor layer.

10. The transistor of claim 9, wherein the channel, the source, the drain, and the gate are arranged in one of:
a bottom-gate top-contact transistor configuration;
a bottom-gate bottom-contact transistor configuration;
a top-gate bottom-contact transistor configuration; and
a top-gate top-contact transistor configuration.

11. The transistor of claim 10, wherein:
the channel, the source, the drain, and the gate are arranged in one of: (i) a bottom-gate top-contact transistor configuration, and (ii) a bottom-gate bottom-contact transistor configuration;
the gate is coupled to a first side of the semiconductor layer through an insulating layer;
the photoactive material is disposed adjacent to, and in contact with, a second side of the semiconductor layer, opposite to the first side of the semiconductor layer.

12. The transistor of claim 10, wherein:
the channel, the source, the drain, and the gate are arranged in a top-gate bottom-contact transistor configuration;
the gate is coupled to a first side of the semiconductor layer through an insulating layer;
the photoactive material is disposed adjacent to, and in contact with, a second side of the semiconductor layer, transverse and/or lateral the first side of the semiconductor layer.

13. The transistor of claim 10, wherein:
the channel, the source, the drain, and the gate are arranged in a top-gate top-contact transistor configuration;
the gate is coupled to a first side of the semiconductor layer through an insulating layer;
the photoactive material is disposed adjacent to, and in contact with, the first side of the semiconductor layer, between the insulating layer and the first side of the semiconductor layer.

14. The transistor of claim 9, wherein the photoactive material comprises one of a photoacid generator, a photobase generator, and a photo-radical generator.

15. The transistor of claim 14, wherein the photoactive material comprises a photoacid generator including at least one compound taken from the group consisting of: ionic (onium salt) compounds and non-ionic compounds.

16. The transistor of claim 14, wherein the photoacid generator comprises an ionic (onium salt) compound taken from the group consisting of metallic material, sulfonate material, sulfonylimide material, and sulfonylmethide material.

17. The transistor of claim 14, wherein the photoacid generator comprises a non-ionic compound taken from the group consisting of organohalide material, sulfonate ester material, sulfonate material, and sulfone material.

18. The transistor of claim 17, wherein the photoacid generator comprises a sulfonate ester material taken from the group consisting of 2-nitrobenzyl ester material, aromatic sulfonate material, oxime sulfonate material, N-sulfonyloxyimide material, sulfonyloxy ketone material, and DNQ 4-sulfonate material.

19. The transistor of claim 17, wherein the photoacid generator comprises a sulfone material taken from the group consisting of disulfone material, ketosulfone material, and sulfonyldiazomethane material.

* * * * *